(12) United States Patent
Jones et al.

(10) Patent No.: US 7,944,670 B2
(45) Date of Patent: May 17, 2011

(54) SURGE PROTECTION CIRCUIT FOR PASSING DC AND RF SIGNALS

(75) Inventors: Jonathan L. Jones, Carson City, NV (US); Chris Penwell, Minden, NV (US)

(73) Assignee: Transtector Systems, Inc., Hayden, ID (US)

( * ) Notice: Subject to any disclaimer, the term of this patent is extended or adjusted under 35 U.S.C. 154(b) by 157 days.

(21) Appl. No.: 12/262,107

(22) Filed: Oct. 30, 2008

(65) Prior Publication Data
US 2009/0109584 A1    Apr. 30, 2009

Related U.S. Application Data

(60) Provisional application No. 60/983,905, filed on Oct. 30, 2007.

(51) Int. Cl.
| H01C 7/12 | (2006.01) |
| H02H 1/00 | (2006.01) |
| H02H 1/04 | (2006.01) |
| H02H 3/22 | (2006.01) |
| H02H 9/04 | (2006.01) |

(52) U.S. Cl. ...................................... 361/119; 361/118
(58) Field of Classification Search .................. 361/119
See application file for complete search history.

(56) References Cited

U.S. PATENT DOCUMENTS

| 2,030,179 A | 2/1936 | Potter |
| 3,167,729 A | 1/1965 | Hall |
| 3,323,083 A | 5/1967 | Ziegler |
| 3,619,721 A | 11/1971 | Westendorp |
| 3,663,901 A | 5/1972 | Forney, Jr. |
| 3,731,234 A | 5/1973 | Collins |
| 3,750,053 A | 7/1973 | LeDonne |
| 3,783,178 A | 1/1974 | Philibert |
| 3,831,110 A | 8/1974 | Eastman |
| 3,845,358 A | 10/1974 | Anderson et al. |
| 3,944,937 A | 3/1976 | Fujisawa et al. |
| 3,980,976 A | 9/1976 | Tadama et al. |
| 4,046,451 A | 9/1977 | Juds et al. |
| 4,047,120 A | 9/1977 | Lord et al. |
| 4,112,395 A | 9/1978 | Seward |
| 4,262,317 A | 4/1981 | Baumbach |
| 4,359,764 A | 11/1982 | Block |
| 4,384,331 A | 5/1983 | Fukuhara et al. |

(Continued)

FOREIGN PATENT DOCUMENTS

CH         675933 A5    11/1990

(Continued)

OTHER PUBLICATIONS

PCT/US03/17050 ISR, May 30, 2003, PCT/WIPO.

*Primary Examiner* — Dharti H Patel
(74) *Attorney, Agent, or Firm* — Snell & Wilmer L.L.P.

(57) ABSTRACT

A surge protection circuit may include a tuned circuit board with traces designed to provide a surge protected and RF isolated DC path while propagating RF signals through the PCB dielectric with microstrip lines. The surge protection circuit utilizes high impedance RF decoupling devices such as quarterwave traces or inductors which isolate the multistage DC protection scheme which may include a gas discharge tube, serial surge impeding devices such as inductors and/or resistors, a decoupled air/spark gap device and a Zener diode junction.

18 Claims, 4 Drawing Sheets

U.S. PATENT DOCUMENTS

| | | | |
|---|---|---|---|
| 4,409,637 | A | 10/1983 | Block |
| 4,481,641 | A | 11/1984 | Gable et al. |
| 4,554,608 | A | 11/1985 | Block |
| 4,563,720 | A | 1/1986 | Clark |
| 4,586,104 | A | 4/1986 | Standler |
| 4,689,713 | A | 8/1987 | Hourtane et al. |
| 4,698,721 | A | 10/1987 | Warren |
| 4,727,350 | A | 2/1988 | Ohkubo |
| 4,984,146 | A | 1/1991 | Black et al. |
| 4,985,800 | A | 1/1991 | Feldman et al. |
| 5,053,910 | A | 10/1991 | Goldstein |
| 5,057,964 | A | 10/1991 | Bender et al. |
| 5,102,818 | A | 4/1992 | Paschke et al. |
| 5,122,921 | A | 6/1992 | Koss |
| 5,124,873 | A | 6/1992 | Wheeler et al. |
| 5,142,429 | A | 8/1992 | Jaki |
| 5,166,855 | A | 11/1992 | Turner |
| 5,278,720 | A | 1/1994 | Bird |
| 5,321,573 | A | 6/1994 | Person et al. |
| 5,353,189 | A | 10/1994 | Tomlinson |
| 5,442,330 | A | 8/1995 | Fuller et al. |
| 5,537,044 | A | 7/1996 | Stahl |
| 5,617,284 | A | 4/1997 | Paradise |
| 5,625,521 | A | 4/1997 | Luu |
| 5,667,298 | A | 9/1997 | Musil et al. |
| 5,721,662 | A | 2/1998 | Glaser et al. |
| 5,781,844 | A | 7/1998 | Spriester et al. |
| 5,790,361 | A | 8/1998 | Minich |
| 5,844,766 | A | 12/1998 | Miglioli et al. |
| 5,854,730 | A | 12/1998 | Mitchell et al. |
| 5,953,195 | A | 9/1999 | Pagliuca |
| 5,966,283 | A | 10/1999 | Glaser et al. |
| 5,982,602 | A | 11/1999 | Tellas et al. |
| 5,986,869 | A | 11/1999 | Akdag |
| 6,054,905 | A | 4/2000 | Gresko |
| 6,060,182 | A | 5/2000 | Tanaka et al. |
| 6,061,223 | A | 5/2000 | Jones et al. |
| 6,115,227 | A | 9/2000 | Jones et al. |
| 6,137,352 | A | 10/2000 | Germann |
| 6,141,194 | A | 10/2000 | Maier |
| 6,177,849 | B1 | 1/2001 | Barsellotti et al. |
| 6,236,551 | B1 | 5/2001 | Jones et al. |
| 6,243,247 | B1 | 6/2001 | Akdag et al. |
| 6,252,755 | B1 | 6/2001 | Willer |
| 6,281,690 | B1 | 8/2001 | Frey |
| 6,292,344 | B1 | 9/2001 | Glaser et al. |
| 6,342,998 | B1 | 1/2002 | Bencivenga et al. |
| 6,385,030 | B1 | 5/2002 | Beene |
| 6,421,220 | B2 | 7/2002 | Kobsa |
| 6,721,155 | B2 | 4/2004 | Ryman |
| 6,754,060 | B2 | 6/2004 | Kauffman |
| 6,757,152 | B2 | 6/2004 | Galvagni et al. |
| 6,785,110 | B2 | 8/2004 | Bartel et al. |
| 6,975,496 | B2 | 12/2005 | Jones et al. |
| 7,082,022 | B2 * | 7/2006 | Bishop .................... 361/119 |
| 7,106,572 | B1 | 9/2006 | Girard |
| 7,130,103 | B2 * | 10/2006 | Murata .................... 359/290 |
| 7,250,829 | B2 * | 7/2007 | Namura .................... 333/104 |
| 2004/0264087 | A1 | 12/2004 | Bishop |
| 2007/0053130 | A1 | 3/2007 | Harwath |
| 2007/0139850 | A1 | 6/2007 | Kamel et al. |

FOREIGN PATENT DOCUMENTS

| | | |
|---|---|---|
| WO | WO 9510116 | 4/1995 |

* cited by examiner

# SURGE PROTECTION CIRCUIT FOR PASSING DC AND RF SIGNALS

CROSS-REFERENCE TO RELATED APPLICATIONS

The present application for patent claims priority from and the benefit of provisional application Ser. No. 60/983,905 entitled "SURGE PROTECTION CIRCUIT FOR PASSING DC AND RF SIGNALS," filed on Oct. 30, 2007, which is expressly incorporated by reference herein.

BACKGROUND

1. Field

The invention relates to surge protection. More particularly, the invention relates to a surge protection circuit for passing dc and rf signals.

2. Related Art

Communications equipment, such as cell towers, base stations, and mobile devices, are increasingly manufactured using small electronic components which are very vulnerable to damage from electrical surges. Surge variations in power and transmission line voltages, as well as noise, can change the frequency range of operation and can severely damage and/or destroy the communications equipment. Moreover, communications equipment can be very expensive to repair and replace.

There are many sources that can cause harmful electrical surges. One source is radio frequency (rf) interference that can be coupled to power and transmission lines from a multitude of sources. The power and transmission lines act as large antennas that may extend over several miles, thereby collecting a significant amount of rf noise power from such sources as radio broadcast antennas. Another harmful source is conductive noise, which is generated by communications equipment connected to the power and transmission lines and which is conducted along the power lines to the communications equipment to be protected. Still another source of harmful electrical surges is lightning. Lightning is a complex electromagnetic energy source having potentials estimated at from 5 million to 20 million volts and currents reaching thousands of amperes.

Ideally, what is needed is a surge protection circuit on a tuned circuit board where the surge protection circuit utilizes high impedance rf decoupling devices, which isolate the multistage dc protection scheme.

SUMMARY

A surge protection circuit may include a tuned circuit board with traces designed to provide a surge protected and RF isolated DC path while propagating RF signals through the PCB dielectric with microstrip lines. The surge protection circuit utilizes high impedance RF decoupling devices such as quarterwave traces or inductors which isolate the multistage DC protection scheme which may include a gas discharge tube, serial surge impeding devices such as inductors and/or resistors, a decoupled air/spark gap device and a Zener diode junction.

A surge protection circuit comprising a circuit board, a gas discharge tube positioned on the circuit board, a surge center pin electrically connected to the gas discharge tube, a coupling microstrip, positioned on the circuit board and connected to the surge center pin, for propagating RF signals, and a protected center pin, connected to the coupling microstrip, for passing DC currents.

A surge protection circuit for passing DC and RF signals comprising a circuit board having a first side and a second side, a surge pin connected to the first side of the circuit board, a protected pin connected to the first side of the circuit board, a first coupling microstrip connected to the first side of the circuit board and connected to the surge pin, and a second coupling microstrip connected to the second side of the circuit board and connected to the protected pin. The surge protection circuit may also include a high-impedance device connected to the first coupling microstrip, an inductor connected to the high-impedance device, and a zener junction device connected to the inductor.

BRIEF DESCRIPTION OF THE DRAWINGS

The features, objects, and advantages of the invention will become more apparent from the detailed description set forth below when taken in conjunction with the drawings, wherein.

DETAILED DESCRIPTION

Figure 1:
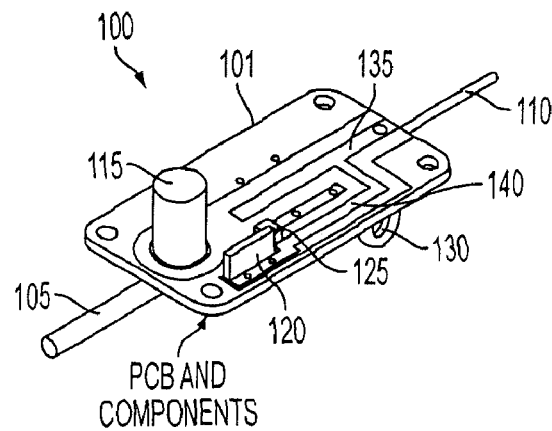
FIG. 1 is a bottom perspective view of a surge protection circuit according to an embodiment of the invention.
Figure 2:
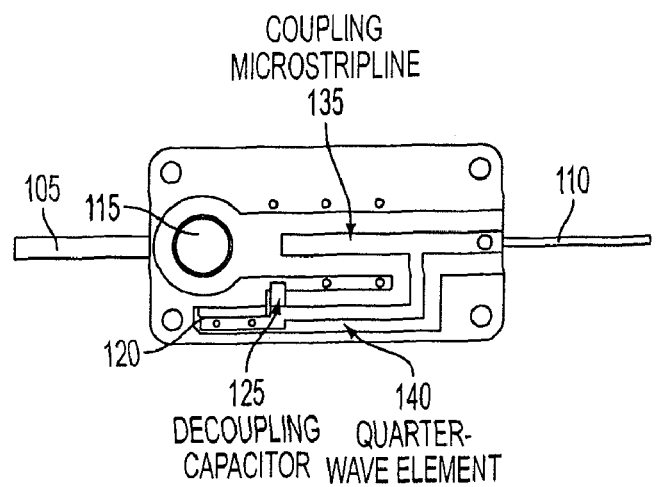
FIG. 2 is a bottom plan view of the surge protection circuit of FIG. 1 according to an embodiment of the invention.

Apparatus, systems and methods that implement the embodiments of the various features of the invention will now be described with reference to the drawings. The drawings and the associated descriptions are provided to illustrate some embodiments of the invention and not to limit the scope of the invention. Throughout the drawings, reference numbers are re-used to indicate correspondence between referenced elements. In addition, the first digit of each reference number indicates the figure in which the element first appears.

FIGS. 1-7 illustrate various views and schematics of a surge protection circuit 100 according to an embodiment of the invention. The surge protection circuit 100 provides RF coupling with DC pass or injector characteristics. The surge protection circuit 100 may include a printed circuit board (PCB) 101, a surge center pin 105, a protected center pin 110, a gas discharge tube 115, a zener junction 120, decoupling capacitors 125, 126 and 128, an impedance device 127, an inductor 130, a coupling microstripline 135, a high impedance element 140, and a spark gap element 145. The components or elements of the surge protection circuit 100 may be soldered to or formed on the PCB 101. The coupling microstripline 135 and the high impedance element 140 may be formed as traces on the PCB 101. The surge protection circuit 100 provides DC passing capabilities, superior voltage limiting protection, a compact size, and reasonable bandwidth.

The surge protection circuit 100 passes DC and RF signals between the surge center pin 105 and the protected center pin 110. The surge center pin 105 and the protected center pin 110 may be a coaxial line where a center pin propagates the DC currents and the RF signals and an outer shield surrounds the center pin. The surge center pin 105 and the protected center pin 110 maintain the system rf impedance (e.g., 50 ohm, 75 ohm, etc.). The DC voltage on the protected center pin 110 is used as the operating voltage to power the electronic components that are coupled to the protected center pin 110.

For high transient surge conditions, the gas discharge tube 115 may be incorporated or positioned on the PCB 101. The lead of the gas discharge tube 115 may be directly connected to the surge center pin 105 to significantly reduce the current flow through the thinner PCB copper traces and the opposite end of the gas discharge tube 115 may be mechanically and electrically connected to the circuit enclosure (not shown) providing a path to ground or connected directly to ground. The gas discharge tube 115 may be implemented to trigger in conjunction with the inductor 130 to add impedance to the surge/dc path. The gas discharge tube 115 is chosen based on capacitance, turn-on voltage, and surge current ratings. The typical ratings may be approximately 1.5 pF capacitance, 150V turn-on and 10 kA surge current.

The zener junction 120 may be a diode integrated into the PCB 101 by laterally embedding it through the PCB 101. That is, the zener junction 120 is positioned through the PCB 101. A first end of the zener junction 120 is connected to the DC pass trace and the inductor 130 and a second end of the zener junction 120 is connected to the PCB ground. During normal operations, the zener junction 120 is transparent. The zener junction 120 may be chosen based on circuit operating voltage, turn-on voltage, and surge current ratings. The typical ratings may be approximately 5 Vdc operating, 6V turn-on and 5 kA surge current.

The decoupling capacitor 125 is connected between the high impedance element 140 and circuit ground. The decoupling capacitor 126 is connected between impedance device 127 and circuit ground. The impedance device 127 (e.g., an inductor and/or a capacitor) may be connected to the inductor 130 and the zener junction 120 and/or the high impedance element 140. In one embodiment, the impedance device 127 can be connected to a DC injector port (see FIG. 7), which allows a current source to be connected to the DC injector port to provide DC currents to the circuit and/or equipment to be protected. The decoupling capacitor 128 is connected between the high impedance element 140 and circuit ground. The decoupling capacitors 125, 126 and 128 provide an RF shunt to stabilize the high impedance elements 140 and also some DC filtering.

Figure 3:
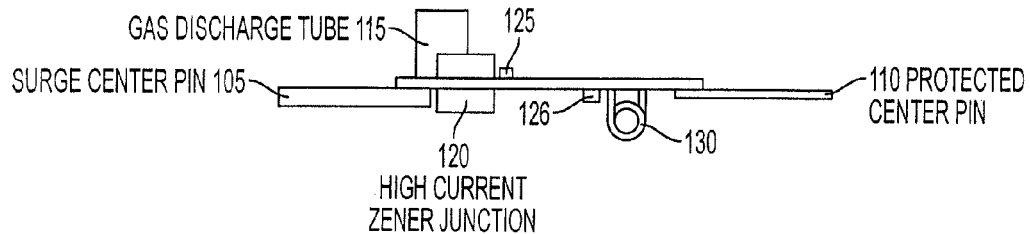
FIG. 3 is a side view of the surge protection circuit of FIG. 1 according to an embodiment of the invention.
Figure 4:
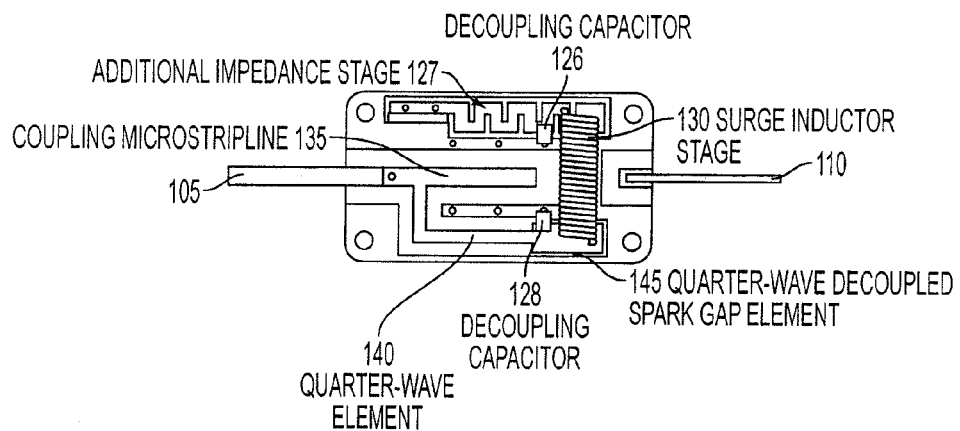
FIG. 4 is a top plan view of the surge protection circuit of FIG. 1 according to an embodiment of the invention.
Figure 5:
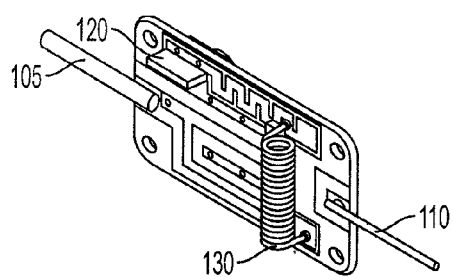
FIG. 5 is a top perspective view of the surge protection circuit of FIG. 1 according to an embodiment of the invention.
Figure 6:
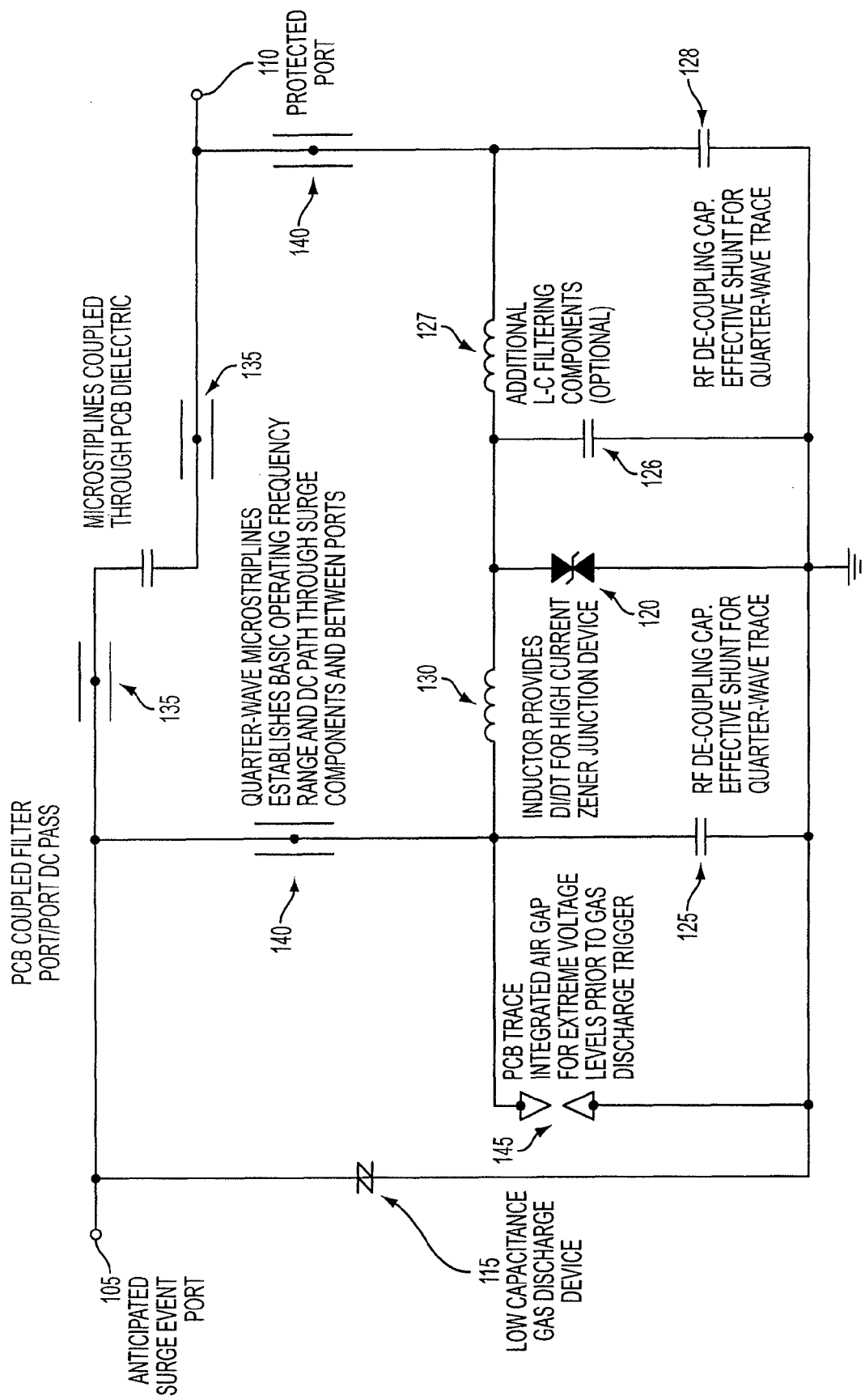
FIG. 6 is a schematic diagram of the surge protection circuit of FIG. 1 according to an embodiment of the invention.
Figure 7:
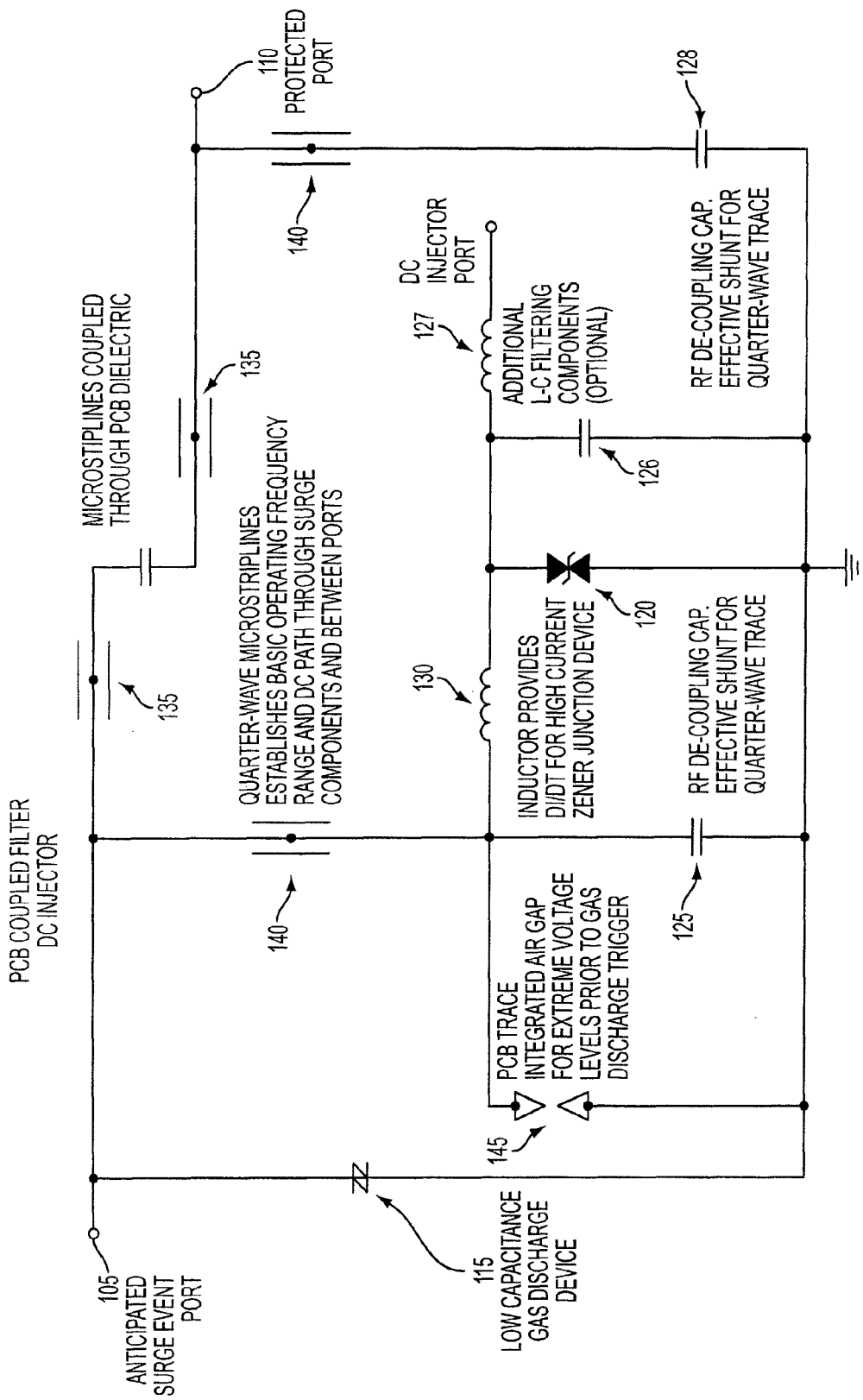
FIG. 7 is a schematic diagram of the surge protection circuit of FIG. 1 according to an embodiment of the invention.

The inductor 130 has an inductance of about >0.5 uH. The inductor 130 is soldered to the PCB 101 and is used to create high surge impedances. The inductor 130 may be attached to a first side of the PCB 101 and the gas discharge tube 115 may be attached to a second or opposite side of the PCB 101 as shown in FIGS. 1 and 3. At low frequencies (e.g., DC or 60 Hz), the inductor 130 is a short and allows these voltages to flow unimpeded to the other components. At higher voltage wavefronts and di/dt levels, the inductor 130 will impede currents and develop a voltage drop effectively attenuating voltage levels to the next protection stages. The inductor 130 also delays the surge currents to allow the gas discharge tube 115 time to trigger.

The coupling microstrips 135 may act as a transmission line (e.g., 50 ohm, 75 ohm, etc.) for the RF signals. RF coupling is achieved through line-line coupling on the PCB 101. The dielectric properties of the PCB 101 act as a capacitor allowing high frequency signals to be coupled between the dielectric while blocking all DC voltages. To achieve the RF coupling through the PCB 101, the width and length of the coupling microstrips 135 are a function of frequency so that the impedance between the surge center pin 105 and the protected center pin 110 is low and the amount of coupling of the RF energy is high.

To increase the RF impedance to DC components (e.g., diode, MOV, etc.) on the PCB 101, the high impedance element 140 is used to create a RF open at the desired frequencies. The high impedance element 140 may be of a quarter-wave device or element, inductor, resistor, and combinations thereof. The high impedance element 140 may have a length that is one-quarter the length of the fundamental frequency. An inductive element may also be chosen for lower fundamental frequencies or where PCB size is a premium. The high impedance element 140 is used for relatively narrow band applications. At other frequencies, high impedance element 140 acts as an RF short that improve the out of band rejection of RF signals on the RF path. In one embodiment, the high impedance element 140 is made from the metal or traces on the PCB 101. The high-impedance element 140 has a high resistance characteristic as a function of its frequency. The high-impedance element 140 can have a very low DC resistance, but a very high RF resistance.

The spark gap element 145 is positioned at the end of the high impedance element 140 and is in proximity to a ground trace in case the gas discharge tube 115 does not trigger fast enough during extreme over voltage events. The spark gap element 145 is connected to the decoupling capacitor 125, the inductor 130, and the high impedance element 140. The spark gap element 145 is de-coupled from the RF path and may be configured extremely close in proximity to the circuit ground discharge path without affecting RF performance. The spark gap element 145 may be about 0.025 inches allowing normal multistage action during events of less than about 10 kA 8 us/20 us surge characteristics. Events exceeding this and considered catastrophic will cause a sparkover at the spark gap element 145 effectively shorting the surge center pin 105 to ground.

The PCB ground plane and ground traces are electrically grounded to a box providing a low impedance ground path for surge currents. When the DC voltage on the surge center pin 105 is below a threshold voltage of the zener junction 120, no current passes across the zener junction 120 and all current passes from the surge center pin 105 to the protected center pin 110.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A surge protection circuit comprising:
   a circuit board;
   a gas discharge tube positioned on the circuit board;
   a surge center pin electrically connected to the gas discharge tube;
   a coupling microstrip, positioned on the circuit board and connected to the surge center pin, for propagating RF signals;
   a protected center pin, connected to the coupling microstrip, for passing DC currents; and a spark gap element isolated from the coupling microstrip by a high impedance element of quarter-wave or inductor type.

2. The surge protection circuit of claim 1 wherein the high impedance element is positioned on the circuit board and connected to the coupling microstrip.

3. The surge protection circuit of claim 2 wherein the high impedance element is selected from a group consisting of a quarter-wave element, an inductor, a resistor, and combinations thereof.

4. The surge protection circuit of claim 2 further comprising a zener junction device connected to the high impedance element.

5. The surge protection circuit of claim 2 further comprising:
an inductor connected to the high impedance element; and
a zener junction device connected to the inductor.

6. The surge protection circuit of claim 5 further comprising an impedance device connected to the inductor and positioned on the circuit board.

7. The surge protection circuit of claim 6 wherein the spark gap element is connected to the high impedance element.

8. The surge protection circuit of claim 7 wherein the inductor has a first end connected to the spark gap element and a second end connected to the impedance device.

9. A surge protection circuit for passing DC and RF signals comprising:
a circuit board having a first side and a second side;
a surge pin connected to the first side of the circuit board;
the protected pin connected to the first side of the circuit board;
a first coupling microstrip connected to the first side of the circuit board and connected to the surge pin;
a second coupling microstrip connected to the second side of the circuit board and connected to the protected pin;
a high-impedance device connected to the first coupling microstrip;
an air gap device connected to the high-impedance device;
an inductor connected to the high-impedance device; and
a zener junction device connected to the inductor.

10. The surge protection circuit of claim 9 further comprising a gas discharge device connected to the surge pin and connected to the first side of the circuit board.

11. The surge protection circuit of claim 9 wherein the high impedance device is selected from a group consisting of a quarter-wave element, an inductor, a resistor, and combinations thereof.

12. The surge protection circuit of claim 9 wherein the zener junction device is positioned through the circuit board.

13. The surge protection circuit of claim 9 wherein the zener junction device is a zener diode.

14. The surge protection circuit of claim 9 wherein the air gap device is integrated into the circuit board.

15. The surge protection circuit of claim 9 further comprising a DC injector port connected to the inductor.

16. The surge protection circuit of claim 9 wherein the spark gap element is isolated from an RF path using the high-impedance device.

17. The surge protection circuit of claim 9 further comprising a first decoupling capacitor connected to a first end of the inductor.

18. The surge protection circuit of claim 17 further comprising a second decoupling capacitor connected to a second end of the inductor.

* * * * *